United States Patent [19]

Sato

[11] Patent Number: 5,235,331
[45] Date of Patent: Aug. 10, 1993

[54] KEY SCANNING APPARATUS
[75] Inventor: Kazuya Sato, Kawasaki, Japan
[73] Assignee: Kabushiki Kaisha Toshiba, Kawasaki, Japan
[21] Appl. No.: 704,998
[22] Filed: May 28, 1991
[30] Foreign Application Priority Data May 28, 1990 [JP] Japan .................................. 2-138128

[51] Int. Cl.$^5$ ......................................... H03M 11/20
[52] U.S. Cl. ....................................... 341/26; 340/711
[58] Field of Search .............. 340/706, 711, 712, 707, 340/708; 178/18, 19; 341/22, 26

[56] References Cited
U.S. PATENT DOCUMENTS

| 3,950,743 | 4/1976 | Hatano et al. | 341/26 X |
| 4,068,226 | 1/1978 | Bowman et al. | 341/26 X |
| 4,103,289 | 7/1978 | Kolber | 341/26 X |

Primary Examiner—Donald J. Ysuko
Assistant Examiner—Michael Horabik
Attorney, Agent, or Firm—Foley & Lardner

[57] ABSTRACT

A key scanning apparatus includes display control circuit for receiving display data and for generating a display control signal which includes display timing periods for driving a display and key scan timing periods for scanning a key matrix. The display timing periods and the key scan timing periods appear in the display control signal in a time sharing manner. The key scanning apparatus also includes a key scan control circuit for outputting a key scan signal to scan the key matrix on the basis of the display control signal and selector for selectively applying either one of the display control signal and the key scan signal to data transfer lines. When the selector outputs the display control signal to the data transfer lines, transfer display data is transferred, and when the selector outputs the key scan signal to the transfer lines, key scan data is transferred. An interrupt control circuit is also provided which generates and outputs a key scan interrupt request signal to the CPU and a key data hold circuit is also provided which receives and holds key data from the key matrix in synchronism with the key scan signal, applies the held data to the CPU, and generates a key scan inhibit signal to inhibit the succeeding key scan operation until the held key data is read by the CPU.

3 Claims, 3 Drawing Sheets

KEY SCANNING APPARATUS

BACKGROUND OF THE INVENTION

1. Field of the Invention

The present invention relates to a key scanning apparatus for a computer system, and more specifically to a key scanning apparatus suitable for use in a microcomputer.

2. Description of the Related Art

FIG. 3 is a block diagram showing a prior-art key scanning apparatus. In a microcomputer 1, in general, output terminals 5 for outputting a display drive signal to drive a display element 3 are used in common with output terminals for outputting a key scan signal to scan select lines of a key matrix 7. This is because when two separate terminals are provided, the number of terminals increases. As shown in FIG. 4, key scan timing periods are periodically interposed during the display operation, and interruption to a key scan routine (referred to as key scan interrupt) is requested to a CPU (not shown) in response to a rise time of the key scan timing period.

In the prior-art microcomputer, in response to the key scan interrupt, the CPU outputs the key scan signal via the display drive output terminal 5 and simultaneously reads a key data from the key matrix 7. In addition to the above operation, the CPU monitors the time elapsed, and restarts the display operation, because the key scan timing is released after a constant time determined as a key scan timing has elapsed.

With the advance of more complex microcomputer applications, there exists a need for higher key scan performance. In the conventional microcomputer, however, the processing for reading the key data and also almost all processing for scanning keys (e.g. generation of a key scan signal, monitoring of key scan timing, etc.) is executed by the CPU in dependence upon software. Thus, a large work load is applied to the CPU and software, so that it has been difficult to improve the key scan performance without exerting a harmful influence upon other processing functions.

In addition, since the display is interrupted in the key scan timing period, the key scan timing must be limited to such a short time period that no harmful influence (e.g. flickering) is exerted upon the display operation. Therefore, when other interruption factors each having a priority higher than that of the key scan interrupt occur in parallel, the key scan interrupt which has a lower priority order in general is delayed as shown in FIG. 5; since interruptions are executed in accordance with a priority order determined by a daisy chain of interrupt reception. This results in a problem in that it is difficult to complete the key scan processing within a limited key scan timing period. On the other hand, in the system in which the key scan timing release is controlled by the CPU, since the display interrupt time period inevitably increases, there arises another problem in that the display quality is deteriorated due to, for example, flickering.

SUMMARY OF THE INVENTION

With these problems in mind, therefore, it is an object of the present invention to provide a key scanning apparatus for automatically executing key scan processing (except key data reading operation) instead of using the CPU in order to reduce the work load applied to the CPU and to improve the key scan performance.

According to the present invention, there is provided a key scanning apparatus for a computer system, comprising: display control means for generating a display control signal including display timing periods to drive a display element and key scan timing periods to intermittently execute key scanning operation; key scan control means for outputting a key scan signal to scan a key matrix on the basis of the display control signal; selecting means for selectively applying the display control signal and the key scan signal to terminals to which the display element and the key matrix are connected in common; interrupt control means for generating and outputting a key scan interrupt request signal to a CPU of the computer system in synchronism with the key scan signal; and key data holding means for receiving and holding a key data from the key matrix in synchronism with the key scan signal, and for applying the held key data to the CPU in such a way as to be readable by the CPU.

In the key scanning apparatus according to the present invention, the key scan signal is generated intermittently and sent to the key matrix; a key scan interrupt request signal is simultaneously sent to the CPU; and further a key data is read from the key matrix and held by the apparatus.

Furthermore, even if the key scan interrupt request is received with a delay in accordance with the daisy chain, since the key data is kept held in the key scanning apparatus, the CPU can securely read out the key data, without exerting any harmful influence upon the display function.

Accordingly, in the present invention, since the major procedure required for key scanning operation is executed without being dependent upon software, it is possible to reduce the load applied to the software. Furthermore, since the key data is kept held, it is unnecessary for software to check whether the present timing period is a key scan timing or not. As a result, the key scan performance or ability can be improved without exerting any harmful influence upon display quality.

BRIEF DESCRIPTION OF THE DRAWINGS

In the attached drawing.

DESCRIPTION OF THE PREFERRED EMBODIMENT

Figure 1:
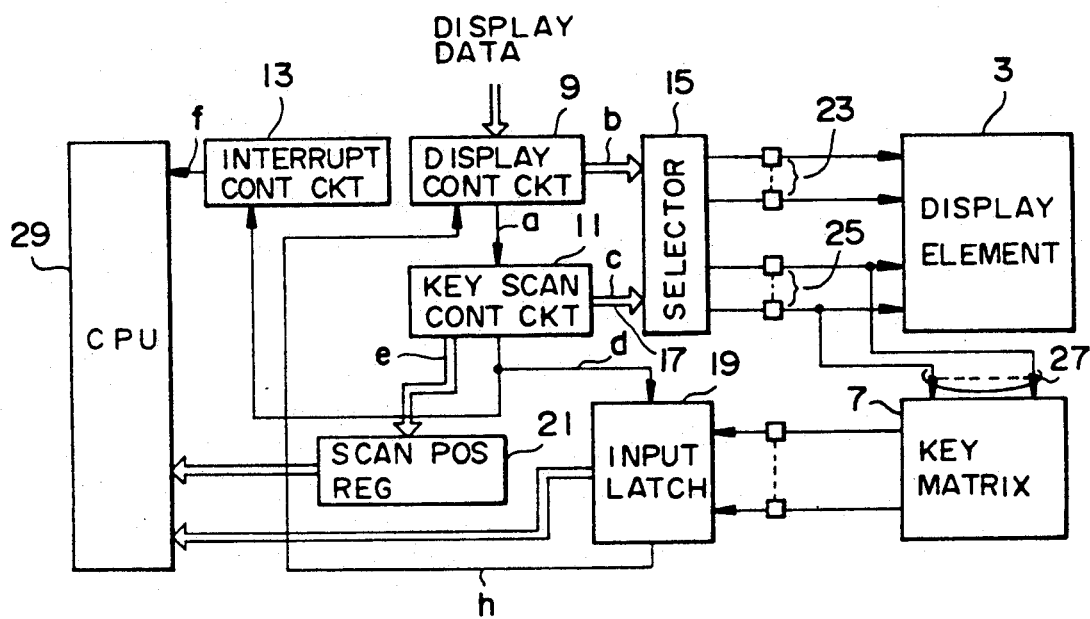
FIG. 1 is a block diagram showing an embodiment of the key scanning apparatus according to the present invention.
Figure 2:
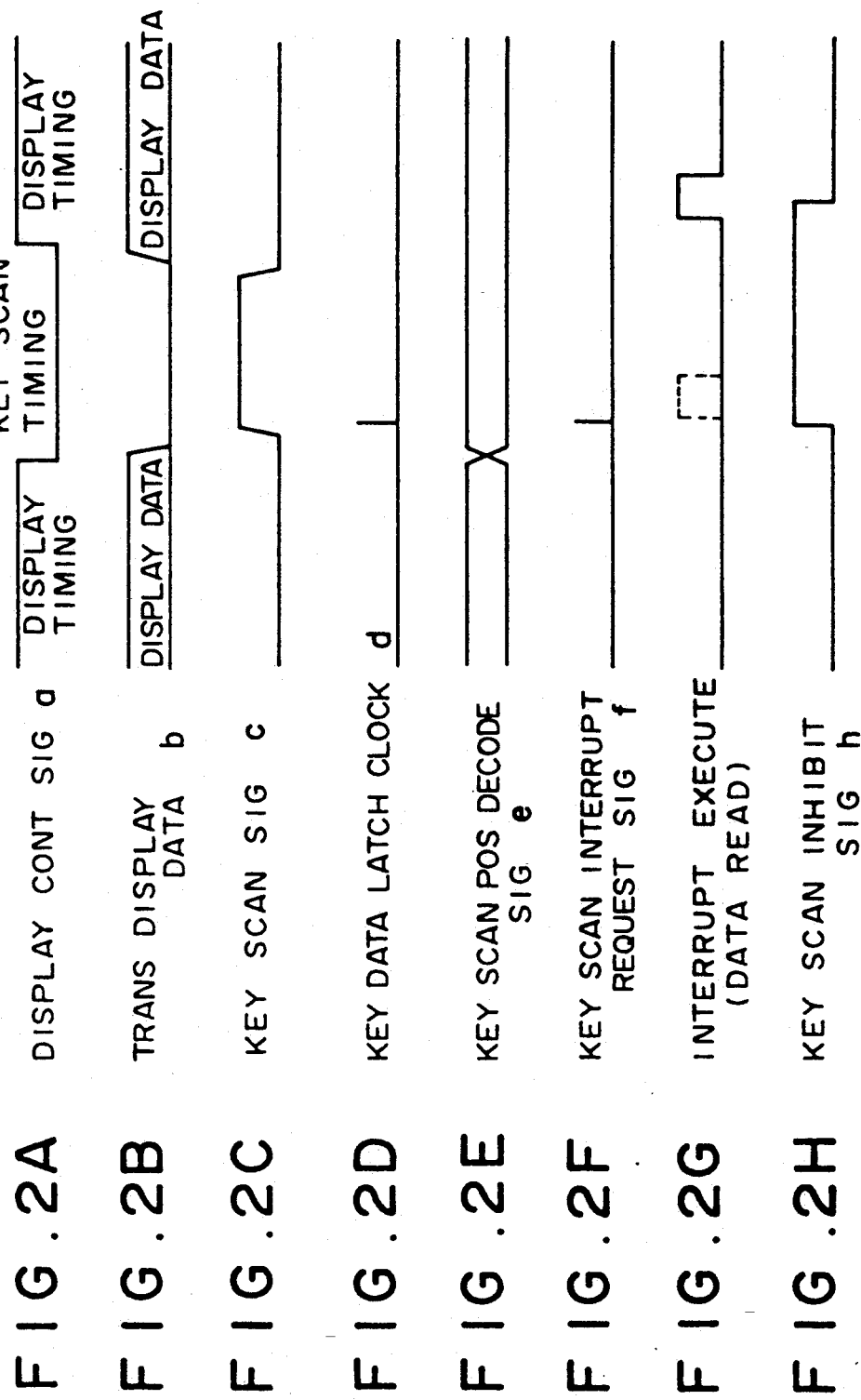
FIG. 2 is a timing chart for assistance in explaining the operation of the embodiment shown in FIG. 1.
Figure 3:
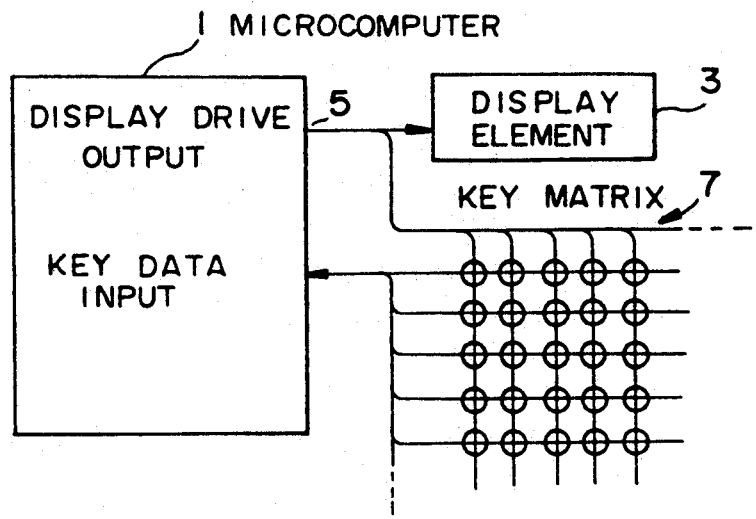
FIG. 3 is a block diagram showing an ordinary microcomputer for executing display and key scanning operation.
Figure 4:
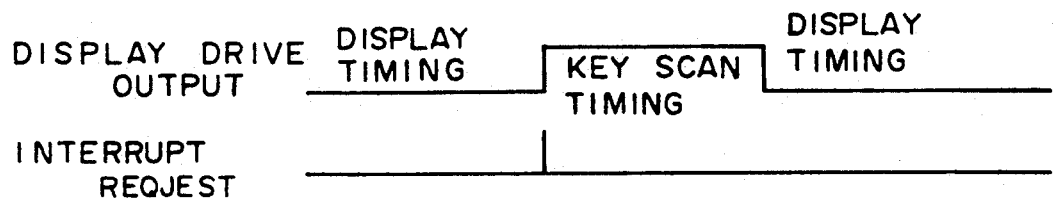
FIGS. 4 and 5 are timing charts for assistance in explaining a problem involved in the key scanning operation by the conventional microcomputer.
Figure 5:
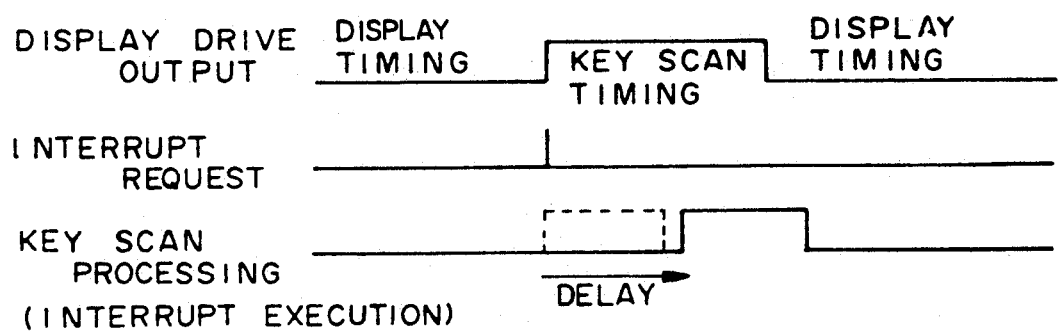

FIG. 1 shows a configuration of an embodiment of the key scanning apparatus according to the present invention, and FIG. 2 shows the operation of the embodiment shown in FIG. 1.

In FIG. 1, a display control circuit 9 controls the switching operation from display timing to key scan timing or vice versa and the transfer operation of the display data. That is, the display control circuit 9 receives an external display data of a predetermined number of bits from the outside (e.g. memory unit (not shown) or CPU 29), forms a display control signal a (FIG. 2A), sends the formed signal to a key scan control circuit 11, and transfers a transfer display data b (FIG. 2B) to a selector 15 in synchronism with the display timing. This display control signal indicates the display timing at the high level but the key scan timing at the low level. The key scan timing is periodically generated at a predetermined frequency and has a predetermined time width. As understood with reference to FIGS. 2A and 2B, the display data is not transferred at the key scan timing, and all the bits of the transfer display data are fixed at the low level.

A key scan control circuit 11 counts the pulse trailing (fall) edges of the display control signal a, and outputs the counted number to a scan position register 21 as a key scan position decode signal e (FIG. 2E). Further, the key scan control circuit 11 selects one signal line corresponding to the counted number from a bus 17 connected to the selector 15, and outputs a high-level key scan signal c (FIG. 2C) to the selected signal line in synchronism with the key scan timing. In addition, the key scan control circuit 11 forms a key data latch clock d (FIG. 2D) when the key scan signal c is kept at high level, and sends it to an input latch 19.

The selector 15 is provided with a plurality of cathode drive terminals 23 connected to cathodes of a display element 3 and a plurality of anode drive terminals 25 connected to anodes of the display element 3. The anode drive terminals 25 are further connected to a plurality of select lines 27 of a key matrix 7. The selector 15 fixes either one of the cathode drive terminals 23 at high level when receiving the display data transferred from the display control circuit 9 (i.e. during the display timing period), and transfers the received display data to the anode drive terminals 25. The display element 3 displays a character corresponding to the display data, because digit data are sent from the selector 15 to the cathode drive terminals 23.

On the other hand, the selector 15 fixes the cathode drive terminals 23 at low level when the transfer display data b is fixed at low level (i.e. during the key scan timing period), and transfers the data inputted from the bus 17 to the anode drive terminals 25. Under these conditions, the display operation is interrupted because the cathodes of the display element 3 are fixed at low level, and the key scan signal c is applied to one of the select lines 27 of the key matrix 7 to enable the select line to be accessible to the key matrix 7.

In response to the data latch clock sends d from the key scan control circuit 11, an input latch 19 receives and latches a key data via the select line accessible to the key matrix 7. Upon key data latch, the input latch 19 generates and outputs a high-level key scan inhibit signal h (FIG. 2H) to the display control circuit 9. While this key scan inhibit signal h is kept outputted, the display control circuit 9 inhibits the succeeding key scan timing from being generated.

An interrupt control circuit 13 generates and sends a key scan interrupt request signal f (FIG. 2F) to the CPU 29 in synchronism with the data latch clock d. In response to the key scan interrupt signal f, the CPU 29 immediately executes a key scan interrupt processing in usual (dashed lines in FIG. 2G). In this interrupt processing, the CPU 29 merely reads a key scan position decode signal e and a key data from a scan position register 21 and the input latch 19, respectively. Therefore, in case the interrupt operation being executed is delayed, as shown by solid lines in FIG. 2G, in accordance with the interrupt reception daisy chain, since the key scan position decode signal e and the key data are both kept stored in the scan position register 21 and the input latch 19, respectively, the CPU 29 can always read a correct key data.

After the CPU 29 has read the key data, the input latch 19 releases the key scan inhibit signal h. Thereafter, the display control circuit 9 generates the key scan timing again, repeating the above operation. Accordingly, since the work load applied to the CPU 29 for key scanning operation can be reduced markedly by the apparatus constructed as described above, it is possible to shorten the time required for the key scanning operation and improve the key scan performance. In addition, in the case where the key scanning operation is required simultaneously with other interruption requirements having a higher priority order, it is possible to securely execute the key scan processing without exerting any harmful influence upon the display quality. On the other hand, work load applied to software can be reduced, thus allowing the time duration required for system search and development to be shortened.

Without being limited to the above-mentioned embodiment, the present invention can be modified in various ways without departing from the gist thereof. For instance, in the above embodiment, the key matrix 7 is allowed to be accessible via only a single select line during the single key scan timing. Without being limited thereto, however, it is also possible to allow the key matrix 7 to be accessible via a plurality of select lines.

What is claimed is:

1. A key scanning apparatus for a computer system having a CPU, a key matrix and display, said apparatus comprising:

display control means for receiving display data and for generating a display control signal which is comprised of display timing periods to drive said display and key scan timing periods to scan said key matrix, said display timing periods and said key scan timing periods appearing in a time sharing manner;

key scan control means for outputting a key scan signal to scan said key matrix on the basis of said display control signal;

selecting means for selectively applying either one of said display control signal and said key scan signal to data transfer lines which operate as display data transfer lines when said selecting means outputs said display control signal and as key scan data transfer lines when said selecting means outputs said key scan signal;

interrupt control means for generating and outputting a key scan interrupt request signal to the CPU in such a way as to be readable by the CPU; and key data hold means for receiving and holding key data output from the key matrix in synchronism with the key scan signal, for applying the held data to the CPU so as to be readable by the CPU, and for generating a key scan inhibit signal to inhibit a succeeding key scan operation until the held key data is read by the CPU.

2. The key scanning apparatus of claim 1, further comprising key scan position holding means for holding a key scan position decode signal.

3. A key scanning apparatus for a computer system having a CPU, a key matrix and display, said apparatus comprising:

display control means for receiving display data for generating a display control signal which is comprised of display timing periods to drive said display and key scan timing periods to scan said key matrix and for generating a display data signal, said display timing periods and said key scan timing periods appearing in a time sharing manner;

key scan control means for receiving said display control signal and for outputting a key scan signal to scan said key matrix on the basis of said display control signal;

selecting means for receiving and for selectively applying either one of said display data signal and said key scan signal to data transfer lines which operate as display data transfer lines when said selecting means outputs said display data signal and as key scan data transfer lines when said selecting means outputs said key scan signal, said display data transfer lines transferring display data to said display so that a character corresponding to said display data is displayed by said display and said key scan data transfer lines transferring key scan data to said key matrix such that operation of said display is interrupted;

interrupt control means for generating and outputting a key scan interrupt request signal to the CPU in such a way as to be readable by the CPU; and key data hold means for receiving and holding key data output from the key matrix in synchronism with the key scan signal, for applying the held data to the CPU so as to be readable by the CPU, and for generating and sending a key scan inhibit signal to said display control means to inhibit a succeeding key scan operation until the held key data is read by the CPU.

* * * * *